United States Patent
Dubler et al.

(10) Patent No.: US 11,527,860 B2
(45) Date of Patent: Dec. 13, 2022

(54) APPARATUS TO DETERMINE QUALITY OF TERMINATION OF WIRE USING THERMAL CHARACTERISTICS

(71) Applicants: TE Connectivity Services GmbH, Schaffhausen (CH); Tyco Electronics UK Ltd., Swindon (GB)

(72) Inventors: Robert Allen Dubler, Mechanicsburg, PA (US); Matthew Orlowski, Harrisburg, PA (US); Jonathan Roberts, Doddington (GB)

(73) Assignees: Tyco Electronics UK Ltd.; TE Connectivity Solutions GmbH

( * ) Notice: Subject to any disclaimer, the term of this patent is extended or adjusted under 35 U.S.C. 154(b) by 50 days.

(21) Appl. No.: 17/071,396

(22) Filed: Oct. 15, 2020

(65) Prior Publication Data

US 2021/0119397 A1    Apr. 22, 2021

Related U.S. Application Data

(60) Provisional application No. 62/923,033, filed on Oct. 18, 2019.

(51) Int. Cl.
*B23P 19/00* (2006.01)
*H01R 43/048* (2006.01)
(Continued)

(52) U.S. Cl.
CPC .......... *H01R 43/048* (2013.01); *G01N 25/18* (2013.01); *H01R 43/0207* (2013.01); *H01R 43/0214* (2013.01); *Y10T 29/53209* (2015.01)

(58) Field of Classification Search
CPC ......... Y10T 29/49826; Y10T 29/53209; Y10T 29/53235; F02D 41/1441; G01R 31/69; G01R 31/66; H01R 43/048
(Continued)

(56) References Cited

U.S. PATENT DOCUMENTS 5,197,186 A * 3/1993 Strong .................... B30B 15/14
                                                         29/748
5,678,390 A * 10/1997 Pruett ..................... B65B 51/306
                                                         53/550
(Continued)

FOREIGN PATENT DOCUMENTS

CN      104596572 A     6/2015
CN      105319221 A     2/2016
(Continued)

OTHER PUBLICATIONS

International Search Report, International Application No. PCTIB2020-059791, International Filing Date Oct. 18, 2020.
(Continued)

*Primary Examiner* — Thiem D Phan

(57) ABSTRACT

A wire terminating apparatus and method which allows for determining the quality of a wire termination. The method includes terminating the wire, monitoring the thermal properties of the termination with one or more thermal sensors and comparing the monitored thermal properties to stored thermal properties to determine if the termination is defective. If the termination is defective, the termination is discarded. The apparatus includes a wire termination zone. A thermal sensor is mounted on the wire terminating apparatus proximate the wire termination zone. The thermal sensor monitors the thermal properties of the termination to determine if the termination is defective.

8 Claims, 3 Drawing Sheets

(51) Int. Cl.
*G01N 25/18* (2006.01)
*H01R 43/02* (2006.01)

(58) Field of Classification Search
USPC .................. 29/747, 753, 593, 595, 705, 720
See application file for complete search history.

(56) References Cited

U.S. PATENT DOCUMENTS

| 9,003,645 B1 | 4/2015 | Yost et al. |
| 2015/0047182 A1 | 2/2015 | Charlton et al. |

FOREIGN PATENT DOCUMENTS

| CN | 205919900 U | 1/2017 |
| JP | 20140022053 A | 2/2014 |

OTHER PUBLICATIONS

Yenchek et al. "Operational Characteristics of Trailing Cable Splices" Record of The Industry Applications Conference (IAS). New York, IEEE, US vol. 3, Oct. 8, 1995.

Liu et al. "Contact Resistance Comparison of Good and Bad Crimp Joint With TNNED Wires Under Thermal Shock" New York, NY IEEE, US, vol. Conf. 47 Sep. 10, 2001.

* cited by examiner

APPARATUS TO DETERMINE QUALITY OF TERMINATION OF WIRE USING THERMAL CHARACTERISTICS

FIELD OF THE INVENTION

The invention relates to a method and system for monitoring the quality of a termination of a wire using thermal characteristics of the termination.

BACKGROUND OF THE INVENTION

Wires are terminated using a variety of methods, such as, crimping, soldering or welding. For example, electrical terminals are typically crimped onto wires by a crimping apparatus to form a lead. The crimping apparatus has crimp tooling made up of a first part mounted to a base for supporting the electrical terminal and a second part mounted to a ram that is movable toward and away from the base for effecting the crimp. In operation, the terminal is placed on the first part of the crimp tooling and an end of a wire is inserted into the ferrule or barrel of the terminal. The ram is caused to move toward the base through a crimp stroke, thereby crimping the terminal onto the wire.

Systems have been developed that monitor the quality of the crimps. When a defective crimp is detected, the lead is discarded. Some known crimp quality monitoring systems measure crimp quality by measuring crimp height. Ordinarily, if a terminal is not crimped to the correct crimp height for the particular terminal and wire combination, an unsatisfactory crimp connection will result. However, many unsatisfactorily crimp connections will, nevertheless, exhibit a "correct" crimp height. As such, systems that monitor crimp quality based on crimp height may pass defective leads from the crimping apparatus. Additionally, a crimp height variance or other physical variation in the crimped terminal is not, in and of itself, the cause of a defective crimp connection, but rather, may be indicative of another factor which causes the poor connection. Such factors include using the wrong terminal or wire size, missing strands of wire, short brush, insulation in the crimp, abnormal position of the terminal, wrong wire type, incorrect stripping of insulation and the like. Such defective crimp connections frequently have the appearance of high-quality crimp connections, and therefore, pass inspection.

Other known crimp quality monitoring systems detect a defectively crimped terminal by analyzing the crimping forces imposed on the terminal during the actual crimping operation. For example, the systems collect force and displacement data during the crimp stroke and compare that data with normalized data collected from known good crimps during a learning phase. Such comparison is utilized to determine whether a particular crimp meets acceptable standards. However, crimp quality monitoring systems that monitor crimp quality based on force profiles are not without problems. The systems are inaccurate at measuring certain types of defective crimps. For example, the systems are susceptible to incorrectly identifying crimps having insulation in the barrel as being good crimps. The systems also are susceptible to falsely identifying some good crimps as being defective. In addition, with various materials, such as aluminum wire, there is very little force variation between crimping a terminal with the aluminum wire properly inserted and crimping a terminal with no aluminum wire inserted. Consequently, measuring the force to determine if the crimp is proper is not effective.

A need remains for not only a crimp quality monitoring system, but generally a wire termination quality monitoring system, that may be used to accurately monitor wire termination quality for all types of wires and for different types of terminations.

It would, therefore, be beneficial to provide a wire termination monitoring system and method which can be used to monitor different terminations of wires. In particular, it would be beneficial to provide a wire termination monitoring system and method which does not solely measure force or dimensions, but monitors the thermal characteristics of the termination.

SUMMARY OF THE INVENTION

The following provides a summary of certain illustrative embodiments of the present invention. This summary is not an extensive overview and is not intended to identify key or critical aspects or elements of the present invention or to delineate its scope.

An embodiment is directed to a wire terminating apparatus which allows for determining the quality of a termination of a wire. The apparatus includes a wire termination zone. A thermal sensor is mounted on the wire terminating apparatus proximate the wire termination zone. The thermal sensor monitors the thermal properties of the termination to determine if the termination is defective.

An embodiment is directed to a method of determining the quality of a termination of a wire or terminal. The method includes: terminating the wire; monitoring the thermal properties of the termination with one or more thermal sensors; and comparing the monitored thermal properties to stored thermal properties to determine if the termination is defective. If the termination is defective, the termination is discarded.

Additional features and aspects of the present invention will become apparent to those of ordinary skill in the art upon reading and understanding the following detailed description of the exemplary embodiments. As will be appreciated by the skilled artisan, further embodiments of the invention are possible without departing from the scope and spirit of the invention. Accordingly, the drawings and associated descriptions are to be regarded as illustrative and not restrictive in nature.

BRIEF DESCRIPTION OF THE DRAWINGS

The accompanying drawings, which are incorporated into and form a part of the specification, schematically illustrate one or more exemplary embodiments of the invention and, together with the general description given above and detailed description given below, serve to explain the principles of the invention, and wherein.

DETAILED DESCRIPTION OF THE INVENTION

Figure 1:
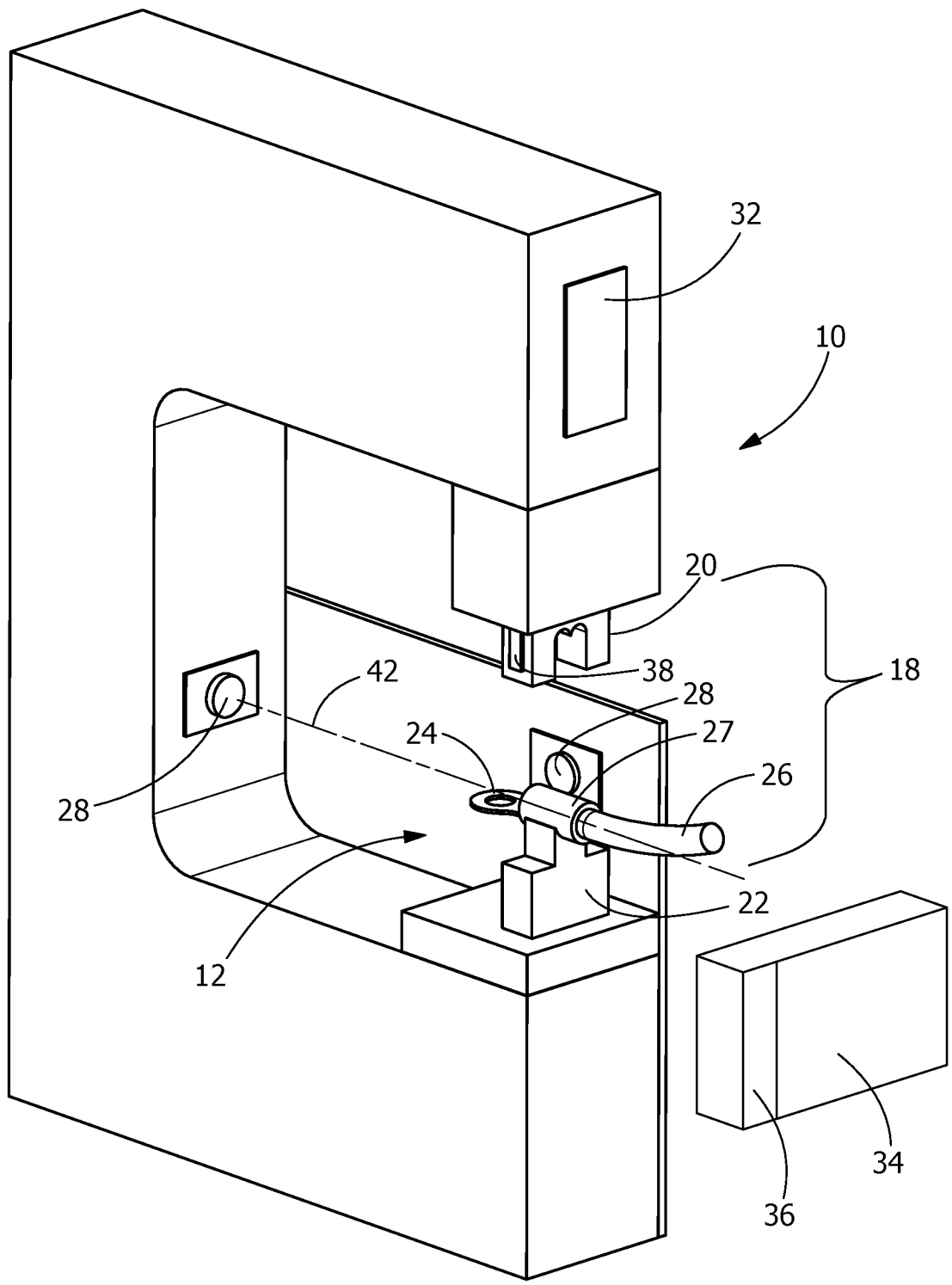
FIG. 1 is a perspective view of an illustrative crimping apparatus using thermal sensors to monitor the quality of the crimp.

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the preferred embodiments. Accordingly, the invention expressly should not be limited to such preferred embodiments illustrating some possible non-limiting combination of features that may exist alone or in other combinations of features, the scope of the invention being defined by the claims appended hereto.

Exemplary embodiments of the present invention are now described with reference to the Figures. Reference numerals are used throughout the detailed description to refer to the various elements and structures. Although the following detailed description contains many specifics for the purposes of illustration, a person of ordinary skill in the art will appreciate that many variations and alterations to the following details are within the scope of the invention. Accordingly, the following embodiments of the invention are set forth without any loss of generality to, and without imposing limitations upon, the claimed invention.

Figure 2:
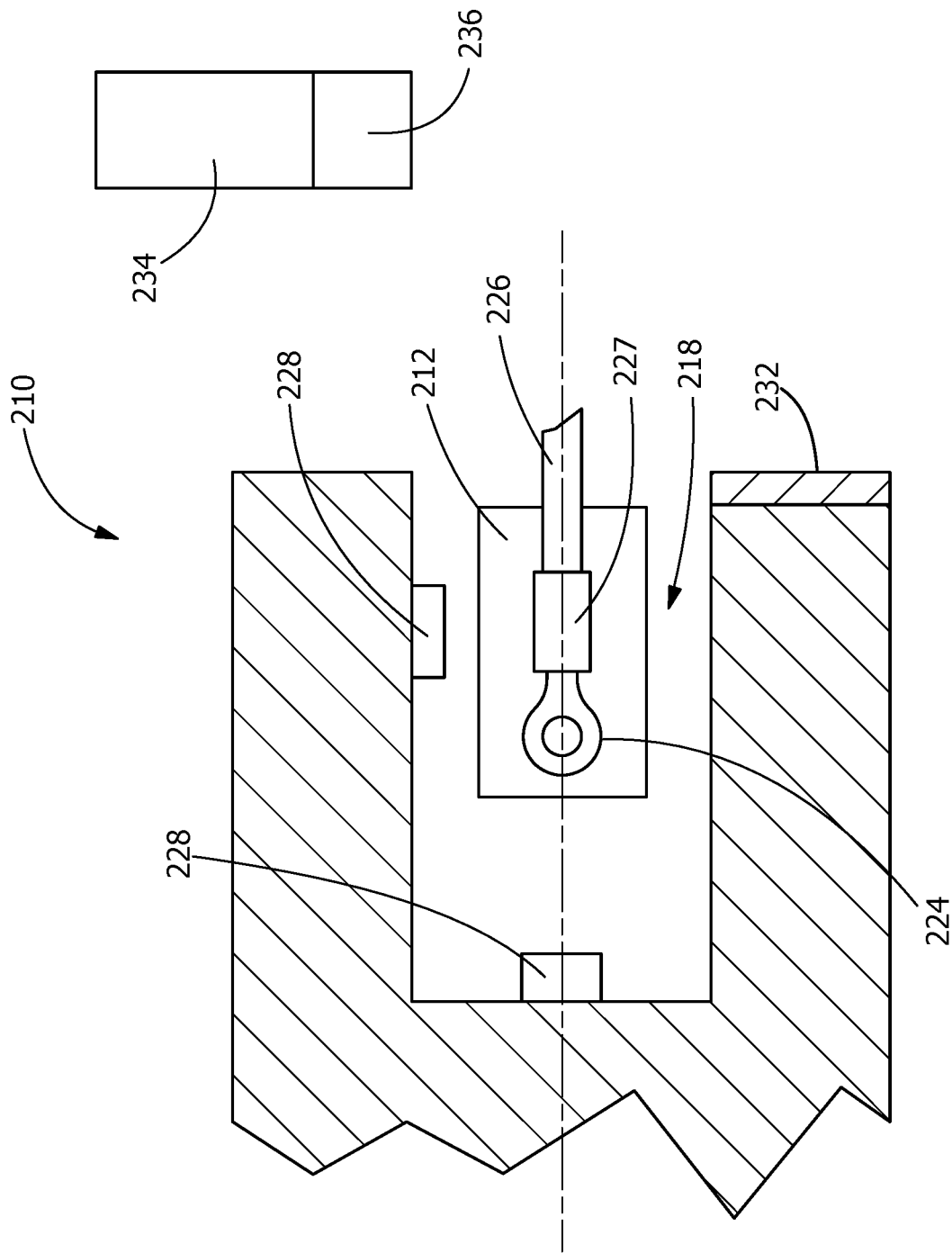
FIG. 2 is a cross-sectional view of an illustrative heating apparatus using thermal sensors to monitor the quality of the termination.

Illustrative wire terminating devices or apparatuses 10, 210 and method of monitoring the wire termination process for the purpose of determining the termination quality by using thermal characteristics and signatures is shown. FIG. 1 illustrates a crimping apparatus 10 which uses thermal characteristics and signatures to determine the quality of the crimp termination. FIG. 2 illustrates a heating apparatus 210 which uses thermal characteristics and signatures to determine the quality of the heat shrink termination. However, the use of the crimping apparatus 10 and the heating apparatus 210 are meant to be illustrative and not limiting. The use of thermal data and analysis, as described below, to monitor the termination of wires, conductors or terminals has other uses beyond just crimp and heat shrink related applications.

FIG. 1 is a perspective view of a crimping apparatus 10 having an applicator 12. The crimping apparatus 10 is illustrated as a terminal crimping apparatus used for crimping terminals to wires. The crimping apparatus 10 is illustrated as a terminal crimping apparatus used for crimping connectors or terminals to wires. FIG. 2 is a cross sectional view of a heating apparatus 210 having a heating element 212 is a heating zone 218. The heating apparatus 210 is used for terminating and sealing connectors or terminals to wires. However, other types of apparatuses may be used, such as an insulation displacement connector (IDC) apparatus, a welding apparatus, and the like, that attach connectors or terminals to wires using processes other than crimping or heat shrink. Alternatively, the crimping apparatus 10 may be another type of crimping apparatus such as a lead frame apparatus.

Referring to FIG. 1, the applicator 12 is coupled to the crimping apparatus 10. The applicator 12 may be removed and replaced with a different applicator, such as when the applicator 12 is worn or damaged or when an applicator having a different configuration is desired. The applicator 12 has a terminating zone or crimping zone 18 and includes a crimper or crimp tooling 20 and an anvil 22 as the mechanical tooling for crimping electrical connectors or terminals 24 to an end of a wire 26 in the crimping zone 18. The anvil 22 is a stationary component of the applicator 12, and the crimp tooling 20 represents a movable component.

One or more thermal sensors 28 are mounted to the crimping apparatus 10. The thermal sensors 28 may be mounted at various locations in or proximate to the crimping zone 18. The thermal sensors 28 may be removably mounted by a removable device, such as, but not limited to, a magnet (not shown). Alternatively, the thermal sensors 28 may be held in place by using mechanical fasteners, latches, adhesives, and the like. While the thermal sensors 28 are shown circular members, the thermal sensors 28 may have other shapes.

Referring to FIG. 2, one or more thermal sensors 228 are positioned in or mounted to the heating apparatus 210. The thermal sensors 228 may be mounted at various locations in or proximate to the heating zone 218. The thermal sensors 228 may be removably mounted by a removable device, such as, but not limited to, a magnet (not shown). Alternatively, the thermal sensors 228 may be held in place by using mechanical fasteners, latches, adhesives, and the like. While the thermal sensors 228 are shown circular members, the thermal sensors 228 may have other shapes.

In an exemplary embodiment, each of the thermal sensors 28, 228 are positioned to have a field of view that includes the crimping zone 18 or heating zone 218. The thermal sensors 28, 228 are positioned to acquire the thermal characteristics, in the form of discrete thermal data, of the terminal 24, 224 and/or the wire 26, 226 in the crimping zone 18 or heating zone 218. In an exemplary embodiment, at least one of the thermal sensor 28, 228 is positioned in-line with a longitudinal axis 42, 242 of the barrel 27 (FIG. 1) or the heat shrink wrap 227 (FIG. 2) of the terminal 24, 224. This allows the thermal sensor 28, 228 to directly sense and collect the thermal data from the thermal energy that is emitted directly from the terminal 24, 224 and/or the wire 26, 226. In an alternate embodiment, one or more of the thermal sensors 28, 228 may be positioned out-of-line or off-center from the axis 42, 242. If one or more of the sensors 28, 228 are positioned out-of-line or off-center from the axis 42, 242, those thermal sensors 28, 228 may collect thermal energy that is transferred through the terminal 24, 224 to the wire 26, 226 or to another object and/or those thermal sensors 28, 228 may collect thermal energy which is reflected off the terminal 24, 224 and/or the wire 26, 226.

For example, positioning bodies or objects around the terminal 24, 224 and/or wire 26, 226 which are configured to intentionally reflect or direct thermal energy from the terminal 24, 224 and/or the wire 26, 226 being sensed would allow a thermal sensor 28, 228 to be out-of-line or off-center from the terminal 24, 224 and read thermal data that is reflected from the surrounding bodies or objects. Construction of these surrounding bodies could be done with materials of known emissivity to enhance the reflected imaging of the thermal characteristics of the terminal 24, 224 and/or the wire 26, 226 being terminated. This would allow the ability to thermally "sense" areas that would not be easy viewed or to view more surface area of the terminal 24, 224 and/or the wire 26, 226 with fewer sensors.

As previously stated, the thermal data collected by the one or more thermal sensors 28, 228 may be one or a combination of three distinct components of energy. The first is thermal energy emitted directly from the terminal 24, 224 and/or the wire 26, 226. The second is thermal energy that is transferred through the object (heat from somewhere else that passes through) such as from the terminal 24, 224 to the wire 26, 226. The third is thermal energy reflected off the terminal 24, 224 and/or the wire 26, 226.

In one exemplary embodiment, the thermal data is captured by a plurality of sensors 28, 228 arranged in a matrix (such as a charge coupled device network) which allows the thermal data to be captured and arranged in rows and columns—similar to how pixels of data describe a visual image collected with a conventional visual energy camera. For example, one thermal sensor may be positioned in-line with the longitudinal axis of the of the terminal, while other thermal sensors of the matrix may be positioned out-of-line or off-center from the axis. Due to the number of data points, techniques, such as but not limited to, an adapted convolution neural network, are used to extract features from these matrices of data to analyze the process of a crimp before, during and after the crimp has been formed. These features are apparent in particular regions of interest on the terminal 24, 224 and/or the wire 26, 226 and form the basis of categorization of the termination.

The characteristics and signatures of the thermal data collect may include, but are not limited to: i) area heating; ii) heat transfer times; iii) heat transfer patterns; iv) temperature delta v) physical characteristics and variations identified through thermal properties.

In addition, the thermal data can be collected at various rates, which results in a time series of images. Using analysis techniques, such as, but not limited to artificial intelligence, the time varying data can be analyzed.

In various illustrative examples, the thermal sensors 28, 228 have the ability to collect absolute temperatures. Absolute temperatures provide the potential for not just analyzing "relative" regions of interest but potentially distinct mechanical characteristics of the termination.

A display device 32, 232 may be communicatively coupled to the thermal sensor 28, 228 and configured to display the thermal characteristics acquired by the thermal sensor 28, 228. The display device 32, 232 may be integrated into a host controller or processor of the crimping apparatus 10 or heating apparatus 210 itself or may be a separate controller or processor 34, 234, such as a desktop computer, a laptop computer, a tablet computer, a monitor, a projector, and the like. Optionally, the display device 32, 232 may be a crimp quality monitor (CQM) device. The controller 34, 234 and/or display device 32, 232 may be coupled to the thermal sensor 28, 228 through a cable or the like. Alternatively, the controller 34, 234 and/or display device 32, 232 may communicate wirelessly through induction, radio frequency waves, Wi-Fi, and the like to transmit data between the thermal sensor 28, 228 and the controller 34, 234 and/or display device 32, 232.

The controller 34, 234 and/or display device may include a storage or memory device 36, 236 such as, but not limited to, a hard disk drive, RAM, ROM, and/or another internal data storage device. The memory device 36, 236 may be configured to store data acquired by the thermal sensor 28, 228. Such data may be used for subsequent quality reporting purposes.

In various examples, as shown in FIG. 1, the crimping apparatus 10 may include additional sensors 38, such as, but not limited to, a force sensor or a linear sensor to provide additional data with respect to the quality of the crimp.

Figure 3:
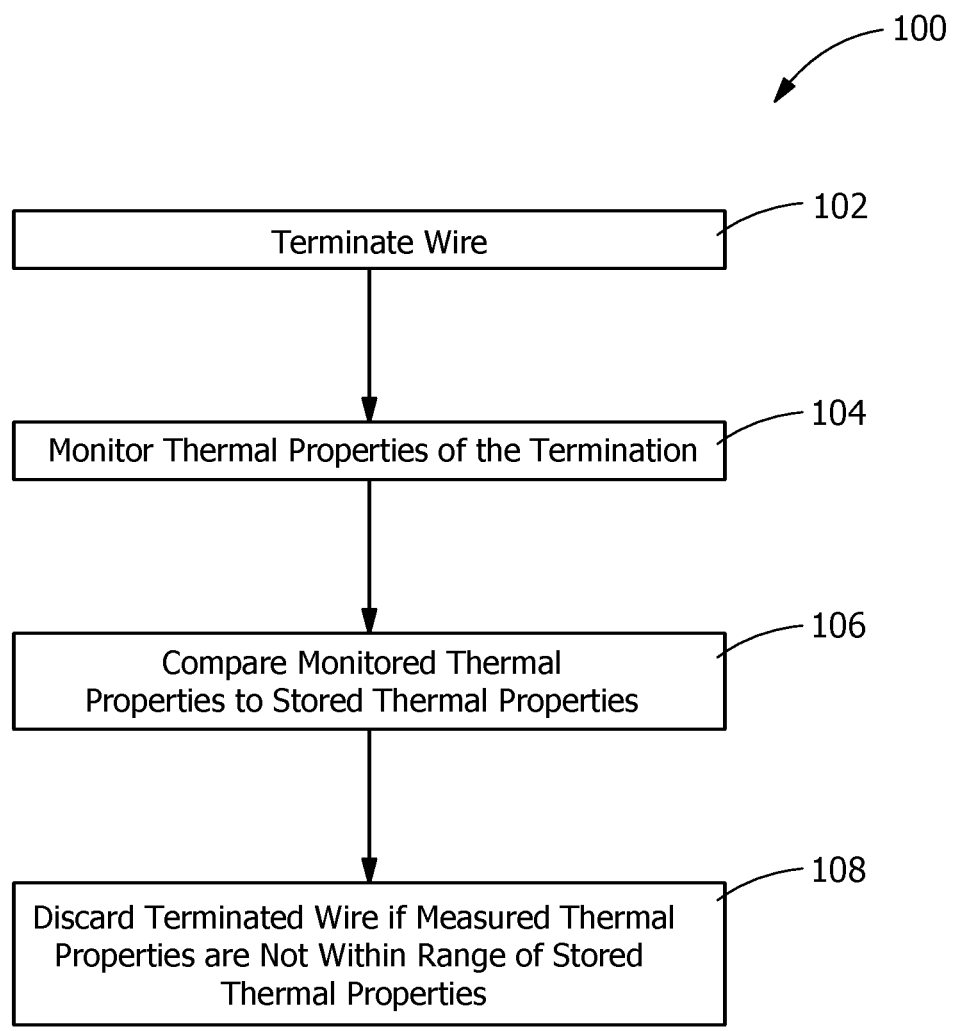
FIG. 3 is a flowchart illustrating an illustrative method of monitoring the quality of a wire termination using thermal properties.

During a crimping operation, the crimp tooling 20 of the crimping apparatus 10 is driven initially towards the stationary anvil 22 and finally away from the anvil 22, thereby terminating the wire 26 as represented by 102 in FIG. 3. During a heating operation, heat is provided in the heating zone 218 of the heating apparatus 210, thereby terminating the wire 226 as represented by 102 in FIG. 3. FIG. 3 illustrates the method of determining the quality of a termination 100.

With respect to the crimping apparatus 10, the crimp stroke has both a downward component and an upward component. The crimping of the terminal 24 to the wire 26 occurs during the downward component of the crimp stroke. The crimp tooling 20 engages the terminal 24 and crimps the terminal 24 onto the wire 26 by compressing the terminal 24 between the crimp tooling 20 and the anvil 22. As this occurs, thermal energy or heat is produced in the terminals 24 and the wires 26 within and proximate to the crimp. With respect to the heating apparatus 210, heat is applied to the terminal 224 and the wire 226 in the heating zone 218. As this occurs, thermal energy or heat is produced in the terminals 224 and the wires 226 within and proximate to the heat shrink sleeve 227.

As previously stated, the thermal sensors 28, 228, either directly from thermal sensors 28, 228 positioned in line with the axis 42, 242 or indirectly from thermal sensors positioned out-of-line or off-center from the axis 42, 242, may acquire temperature measurements/data at designated intervals or continuously of the terminals 24, 224 and the end of the wire 26, 226 positioned in the crimping zone 18 or heating zone 218, as represented by 104 in FIG. 3. The collected temperature measurements/data is transmitted to the display device 32, 232, the controller 34, 234 or the memory device 36, either on the crimping apparatus 10 or the heating apparatus 210 or at an external location from the crimping apparatus 10 or the heating apparatus 210. The temperature measurements/data transmitted by the thermal sensor 28, 228 is used by an operator of the crimping apparatus 10 or the heating apparatus 210 to be able to determine if the termination of the wire meets appropriate standards to provide the desired electrical and mechanical connection. The terms "operator" is used herein to identify the apparatus or person operating or controlling the crimping apparatus 10 or the heating apparatus 210.

By monitoring the temperature of the terminal 24, 224, either directly or indirectly, the quality of the termination may be monitored. By analyzing the temperature of the terminal 24, 224, either directly or indirectly, other characteristics of the termination may be analyzed. For example, the temperature may be used to calculate the forces imported onto the terminal 24, 224, as the amount of force is related to the temperature of the terminal 24, 224 after termination has occurred.

In operation, after the movement of the crimp tooling from the closed position back toward the open position is detected, or after the application of heat in the heating zone 218, the sensors 28, 228 are activated and send data to the controller 34, 234.

In an exemplary embodiment, as represented by 104 in FIG. 3, the thermal characteristics of the termination are measured, either directly or indirectly, during the termination process by the one or more thermal sensors 28, 228. The thermal characteristics are measured at predetermined intervals based on either time or tooling position. For example, a predetermined sample time may be selected, and the thermal characteristics may be measured at each of the discrete sample times. Alternatively, or additionally, the thermal characteristics may be measured when the crimp tooling is at a predetermined crimp height position. The position of the crimp tooling may be detected by a distance sensor (not shown) or the like.

The controller 34, 234 may create a measured temperature profile of the termination based on the measured thermal characteristics. The measured thermal profile is then compared to an acceptable temperature profile or an acceptable temperature profile range of known successful termination, as represented by 106 in FIG. 3. Alternatively, the measured thermal characteristics may be compared to known acceptable temperature characteristics or profiles of the particular materials being used. The acceptable temperature profile or an acceptable temperature profile range may be preinstalled in the controller 34, 234 or may be developed by the user on-site and stored in the controller 34, 234. If the measured temperature profile is within the acceptable temperature profile range, the controller 34, 234 will indicate that the termination is proper. If the measured temperature profile is not within the acceptable temperature profile range, the controller 34, 234 will indicate that the termination is not acceptable and reject the termination, as represented by 108 in FIG. 3. Data relating to the thermal characteristics, the peak temperature, the amount of area below the temperature curve, the shape of the temperature curve, or any combination may be analyzed to determine if the termination is defective.

The use of thermal data and analysis to monitor the termination of wires or conductors has other uses beyond just crimp and heat shrink related applications. For example, thermal analysis of welds (ultrasonic, resistive, etc.), molding, stamping, thermoplastic welding and heat staking (plastic riveting) is beneficial to determine if a proper electrical connection has been secured. In addition to collecting thermal data directly after the termination has occurred to determine if a proper termination has been affected, the thermal sensors may be used to collect thermal data during the termination process, allowing the controller to continue the termination process until such time that a good termination/connection is achieved.

By collecting thermal data during the termination process, either by non-contact methods such as thermal sensors or by direct contact thermal sensors or both the data can be used to provide a quality assessment without the need for destructive testing. In fact, the thermal data can be used to create nondestructive 3D thermal cross sectioning. The use of the thermal data is beneficial in many applications, particularly in applications in which there is very little force variation between terminating a terminal with a wire or terminating one without a wire, for example, when terminating aluminum wire.

While the invention has been described with reference to a preferred embodiment, it will be understood by those skilled in the art that various changes may be made and equivalents may be substituted for elements thereof without departing from the spirit and scope of the invention as defined in the accompanying claims. One skilled in the art will appreciate that the invention may be used with many modifications of structure, arrangement, proportions, sizes, materials and components and otherwise used in the practice of the invention, which are particularly adapted to specific environments and operative requirements without departing from the principles of the present invention. The presently disclosed embodiments are therefore to be considered in all respects as illustrative and not restrictive, the scope of the invention being defined by the appended claims, and not limited to the foregoing description or embodiments.

What is claimed:

1. A wire terminating apparatus which allows for determining the quality of a termination of a wire, the apparatus comprising:
a wire termination zone;
a thermal sensor mounted on the wire terminating apparatus proximate the wire termination zone, the thermal sensor positioned to acquire thermal data of the termination in the wire termination zone;
wherein the thermal sensor monitors the thermal data of the termination to determine if the termination is defective.

2. The crimping apparatus as recited in claim 1, wherein multiple thermal sensors are mounted on the wire terminating apparatus proximate the wire termination zone.

3. The crimping apparatus as recited in claim 1, wherein the thermal sensor is removably mounted to the wire terminating apparatus.

4. The crimping apparatus as recited in claim 1, wherein the thermal sensor is positioned to have a field of view of the wire termination zone.

5. The crimping apparatus as recited in claim 4, wherein the thermal sensor is positioned in line with a longitudinal axis of the wire positioned in the wire termination zone.

6. The crimping apparatus as recited in claim 1, wherein the thermal sensor is positioned off centered from a longitudinal axis of a wire positioned in the wire termination zone, wherein the thermal sensor monitors the thermal properties of the termination which are reflected.

7. The crimping apparatus as recited in claim 1, wherein the wire termination zone has an anvil and a crimp tool which is movable relative to the anvil, the anvil and a crimp tool defining a crimping zone of the wire terminating apparatus.

8. The crimping apparatus as recited in claim 1, wherein the wire termination zone is a heating zone.

* * * * *